United States Patent
Darzy et al.

(10) Patent No.: US 11,962,319 B2
(45) Date of Patent: Apr. 16, 2024

(54) CALIBRATION AND ALIGNMENT

(71) Applicant: Socionext Inc., Kanagawa (JP)

(72) Inventors: Saul Darzy, Maidenhead (GB); Pritty Skaria, Maidenhead (GB)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 17/859,587

(22) Filed: Jul. 7, 2022

(65) Prior Publication Data
US 2023/0034138 A1    Feb. 2, 2023

(30) Foreign Application Priority Data
Jul. 27, 2021   (EP) ..................................... 21188091

(51) Int. Cl.
*H03M 1/66* (2006.01)
*H03M 1/10* (2006.01)
*G06F 1/08* (2006.01)
*G06F 1/10* (2006.01)
*G06F 1/12* (2006.01)
*H03M 1/06* (2006.01)

(52) U.S. Cl.
CPC ............ *H03M 1/1014* (2013.01); *G06F 1/08* (2013.01); *G06F 1/10* (2013.01); *G06F 1/12* (2013.01); *H03M 1/06* (2013.01); *H03M 1/0624* (2013.01)

(58) Field of Classification Search
CPC .... H03M 1/1014; H03M 1/0624; H03M 1/06; G06F 1/12; G06F 1/10; G06F 1/08
See application file for complete search history.

(56) References Cited

U.S. PATENT DOCUMENTS

| | | | |
|---|---|---|---|
| 6,675,307 B1 | 1/2004 | Heitkamp et al. | |
| 8,819,472 B1 * | 8/2014 | Muscha | .............. G06F 1/12 |
| | | | 713/400 |
| 2007/0136627 A1 | 6/2007 | LaBerge et al. | |
| 2016/0004273 A1 | 1/2016 | Chiang et al. | |

FOREIGN PATENT DOCUMENTS

EP    2849021 A1    3/2015

OTHER PUBLICATIONS

Partial European Search Report dated Jan. 21, 2022 issued in the corresponding European Patent Application No. 21188091.9.
Extended European Search Report dated Apr. 29, 2022 issued in the corresponding European Patent Application No. 21188091.9.

* cited by examiner

*Primary Examiner* — Joseph J Lauture
(74) *Attorney, Agent, or Firm* — Rimon P.C.

(57) ABSTRACT

Alignment circuitry including a first clocked latch for receiving a synchronization signal having an enable edge and a target clock signal and outputting an enable signal having an enable edge corresponding to the enable edge of the synchronization signal and synchronized with the target clock signal; a second clocked latch for receiving the enable signal and a delayed target clock signal, being a version of the target clock signal having been delayed by a delay circuit of the clock-controlled circuitry, and outputting a re-timed enable signal having an enable edge corresponding to the enable edge of the enable signal and synchronized with the delayed target clock signal; and gating circuitry for receiving the delayed target clock signal and the re-timed enable signal and to start output of the delayed target clock signal at a timing defined by the enable edge of the re-timed enable signal for controlling the clock-controlled circuitry.

15 Claims, 7 Drawing Sheets

CALIBRATION AND ALIGNMENT

CROSS-REFERENCE OF RELATED APPLICATIONS

This application claims the benefit of European Patent Application No. 21188091.9, filed on Jul. 27, 2021, the entire disclosure of which Application is incorporated by reference herein.

The present invention relates to calibration and alignment, in particular to calibration circuitry and to alignment circuitry, for example for use in a digital-to-analogue converter (DAC), or in an analogue-to-digital converter (ADC). Such circuitry may be implemented as integrated circuitry, for example on an IC chip.

By way of introduction, one example application of the circuitry disclosed herein is for the calibration and alignment of clock signals required by functional units in both DAC and ADC circuitry, which may be implemented on an IC chip.

High-speed DAC and ADC circuitry is typically characterised in that it is necessary to generate and distribute many very-fast clock signals, where the timing of those signals relative to one another and to clock signals in other circuits affects the operation of such functional units and the DAC and ADC circuitry as whole.

Figure 1:
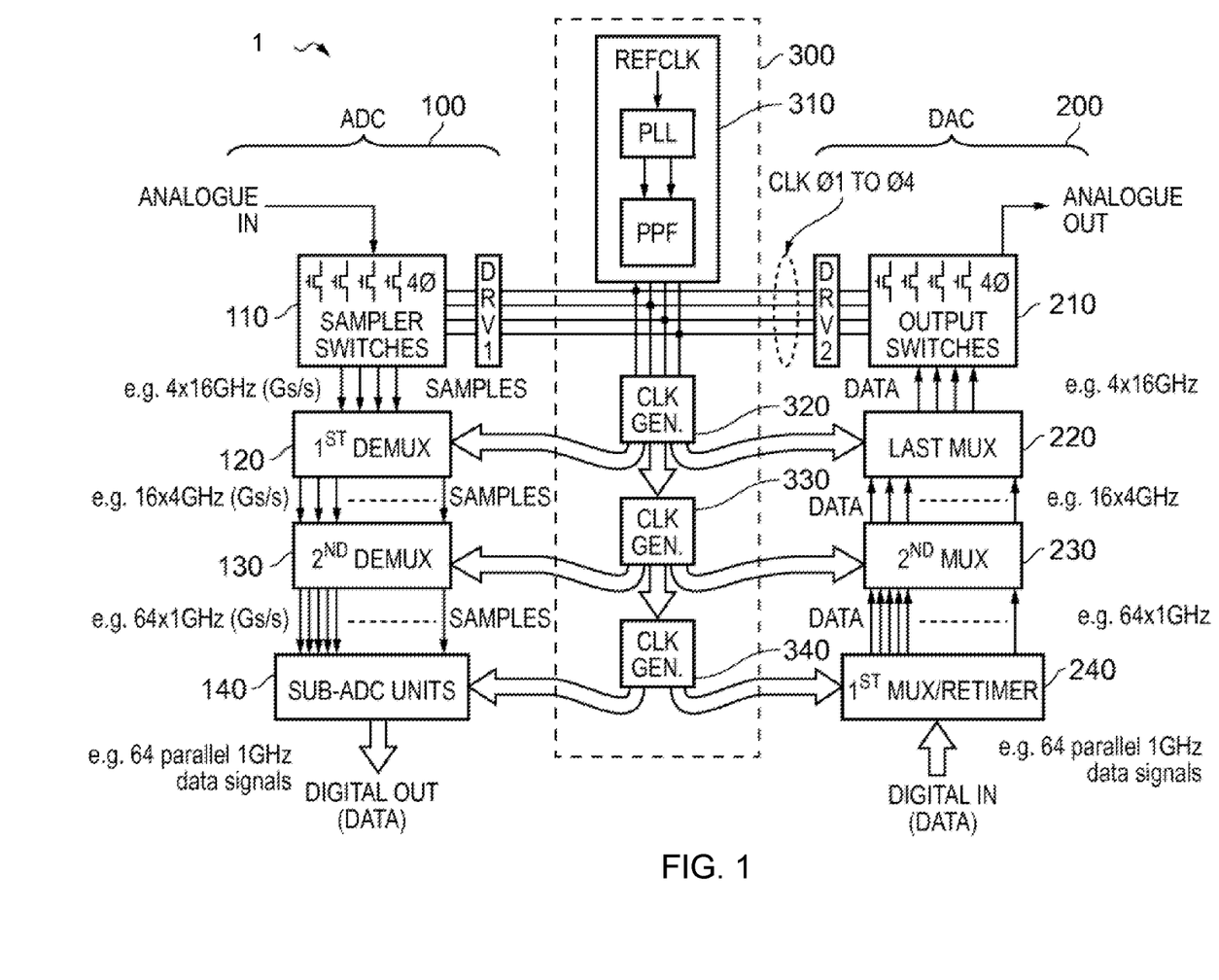
FIG. 1, as mentioned above, is a schematic diagram of ADC and DAC circuitry as a comparative example.

FIG. 1 is a schematic diagram showing parts of combined DAC and ADC circuitry 1, as an example of circuitry in which the present invention may be employed. Circuitry 1 comprises ADC circuitry 100 shown on the left-hand side, DAC circuitry 200 shown on the right-hand side, and clock generation and distribution circuitry 300 shown in the middle.

DAC circuitry 200 comprises a switching circuit 210, which comprises clock-controlled circuitry and data-controlled circuitry. Switching circuit 210 is operable based on input data and clock signals to output an analogue signal representative of the input data.

As a running example, a desired DAC sample rate of 64 Gs/s is assumed, with data signals DATA 1 to DATA 4 (corresponding to the four input data signals shown) input to the switching circuit 210 being 16 GHz (i.e. time-interleaved) data signals. The four input clock signals CLK $\phi1$ to CLK $\phi4$ are assumed to be four time-interleaved 16 GHz clock signals, which are substantially sinusoidal (raised-cosine signals).

Three stages of multiplexing/retiming 220, 230 and 240 are also shown by way of example, in order to input at the first multiplexer/retiming circuit 240 a parallel set of 64 1 GHz data signals when retiming is carried out (or a parallel set of 128 500 MHz signals, when multiplexing is carried out), and output those as a parallel set of 64 1 GHz data signals to the second multiplexer 230, which in turn outputs 16 4 GHz signals to the third and last multiplexer 220, which in turn outputs the data signals DATA 1 to DATA 4 as 4 16 GHz signals as above.

The data signals may be differential data signals, in which case circuitry 210, 220, 230 and 240 may also be differential circuitry.

The switching circuit 210 is representative of a single segment or "slice" in the overall DAC 200. Thus, any coding (e.g. thermometer-coding) of an ultimate input digital signal is assumed to have occurred upstream of the digital signals input in FIG. 1, such that those input digital signals input are only those intended for the segment or slice shown.

The overall DAC 200 would have further slices or segments, each with their own stages of multiplexing/retiming 220, 230 and 240. However, for convenience only one such slice is illustrated in FIG. 1. The analogue outputs of the various slices or segments may be combined to create a single analogue output of the overall DAC. For example, seven segments could be provided to produce the outputs for the 3 MSBs of an 8-bit DAC (with thermometer-encoding), and five segments (in which their outputs are binary weighted) could be provided to produce the outputs for the 5 LSBs. Other variations would of course be possible. For example, an impedance ladder could be employed, as disclosed in EP-A1-2019490.

Also shown in clock generation and distribution circuitry 300 is a clock generator 310 configured to generate the clock signals CLK $\phi1$ to CLK $\phi4$ from a reference clock signal REFCLK and supply them to the switching circuit 210. Further, shown are three stages of clock generation 320, 330, 340, in order to take the input clock signals CLK $\phi1$ to CLK $\phi4$ and generate in turn the clock signals (4 GHz and 1 GHz) required by the three stages of multiplexing/retiming 220, 230, 240, as indicated in FIG. 1. Although the clock signals CLK $\phi1$ to CLK $\phi4$ generated by clock generator 310 are sinusoidal, the clock signals generated by the three stages of clock generation 320, 330, 340 need not be, and may be switched-logic signals. The clock generators shown in FIG. 1 may be considered clock dividers or dividers.

In a similar manner, the ADC circuitry 100 comprises sampler circuitry 110. Again, either single-ended or differential signals could be used.

A similar running example is employed here, i.e. a desired ADC sample rate of 64 Gs/s, and with 2-stages of demultiplexing shown as 120 and 130, each performing 1:4 demultiplexing, and with sub-ADC units 140. The sampler circuitry 110 is configured to take samples from the analogue input at the overall 64 Gs/s sample rate by current steering in current mode, and to output 4 sample streams (single-ended or differential) each at 16 Gs/s (which may be expressed herein as 16 GHz), with the first demultiplexing stage 120 outputting 16 4 Gs/s signals, and with the second demultiplexing stage 130 outputting 64 1 Gs/s signals.

The same clock generation and distribution circuitry 300 (at least, schematically) accordingly provides its clock signals to the ADC circuitry 100, as well as to the DAC circuitry 200. In particular, looking at FIG. 1 and working downwards from the sampler circuitry 110 and switching circuitry 210, in both the DAC and ADC circuitry the signals in successive stages are 4 16 GHz signals, then 16 4 GHz signals, and then 64 1 GHz signals.

ADC circuitry 100 may be considered an "ADC channel" and/or an ADC. DAC circuitry 200 (for example including the other slices not shown) may be considered a "DAC channel" and/or a DAC.

As will be apparent below, DAC/ADC circuitry (or a DAC/ADC) as a whole may be referred to as clock-controlled circuitry (since, for example, the multiplexers are clock-controlled). A DAC comprising a plurality of DACs (each with a plurality of slices such as that shown in FIG. 1 by circuitry 200) may be referred to as clock-controlled circuitry, and the plurality of DACs in this case may be referred to as a plurality of DAC channels. An ADC comprising a plurality of such ADC channels shown in FIG. 1 may be referred to as clock-controlled circuitry. Each channel (DAC or ADC) may be referred to as clock-controlled circuitry.

Looking at the clock generation and distribution circuitry 300 in FIG. 1, the dividers 320, 330, and 340 may be provided "per channel", i.e. per DAC channel and/or per ADC channel. The PLL 310 and the polyphase filter may be provided corresponding to more than one DAC/ADC channel in the overall DAC/ADC (for example all of them).

The clock-controlled circuitry 1 may comprise only an ADC comprising multiple such ADC channels as shown in FIG. 1 and the clock generation and distribution circuitry 300 (with the dividers provided per channel), or only a DAC comprising multiple DAC channels each comprising multiple such DAC slices as shown in FIG. 1 and the clock generation and distribution circuitry 300 (with the dividers provided per channel). The ADC 100 and the DAC 200 are shown together for convenience.

As mentioned above, it is necessary for the clock signals employed in the clock-controlled circuitry 1 to be synchronised relative to each other and synchronised across different DAC/ADC channels, i.e. across different DACs, or different ADCs/sub-ADCs.

According to an embodiment of a first aspect of the present invention, there is provided alignment circuitry for use with clock-controlled circuitry, the alignment circuitry comprising: a first clocked latch configured to receive a synchronization signal having an enable edge (as its data signal) and a target clock signal (as its clock signal) and to output an enable signal having an enable edge corresponding to the enable edge of the synchronization signal and synchronized with the target clock signal; a second clocked latch configured to receive the enable signal (as its data signal) and a delayed target clock signal (as its clock signal), being a version of the target clock signal having been delayed by a delay circuit (or auxiliary circuitry) of the clock-controlled circuitry, and to output a re-timed enable signal having an enable edge corresponding to the enable edge of the enable signal and synchronized with the delayed target clock signal; and gating circuitry configured to receive the delayed target clock signal and the re-timed enable signal and to start output of the delayed target clock signal at a timing defined by the enable edge of the re-timed enable signal for controlling the clock-controlled circuitry.

Such circuitry can help to ensure synchronization across clock-controlled circuitry because the gating circuitry starts output of the delayed target clock signal at the timing defined by the enable edge of the re-timed enable signal. Re-timing the enable signal based on the delayed target clock signal may relax the calibration requirements on the synchronization signal and the target clock signal to ensure synchronization across the clock-controlled circuitry.

The synchronization signal may be a synchronization clock signal or a synchronization enable signal or a synchronization pulse signal.

The delay circuit may comprise a variable delay circuit or a phase rotator or a phase interpolator.

The delay circuit may be configured to, (using clock and data alignment circuitry,) when output of the delayed target clock signal is started: synchronise the delayed target clock signal with a data signal for the clock-controlled circuitry; or synchronise a data signal for the clock-controlled circuitry with the delayed target clock signal.

The clock-controlled circuitry may be digital-to-analogue converter circuitry or analogue-to-digital converter circuitry.

The first clocked latch may comprise: a primary clocked latch configured to receive the synchronization signal having the enable edge (as its data signal) and the target clock signal (as its clock signal) and output an aligned synchronization signal having an aligned enable edge corresponding to the enable edge of the synchronization signal synchronized with the target clock signal; and a secondary clocked latch configured to receive a precursor enable signal (as its data signal) and the aligned synchronization signal (as its clock signal) and output the enable signal having the enable edge which corresponds to the aligned enable edge of the aligned synchronization signal and synchronized with the aligned synchronization signal.

The precursor enable signal may be a logic "1" signal or other static signal configured to cause the secondary clocked latch to output the enable signal having the enable edge which corresponds to the aligned enable edge of the aligned synchronization signal and synchronized with the aligned synchronization signal based on the aligned enable edge of the aligned synchronization signal.

At least one of the primary, secondary, and second clocked latches may comprise a flip flop.

At least one of the primary, secondary, and second clocked latches may comprise a D-type (or data-type) flip flop.

The gating circuitry may comprise an AND logic gate.

The output of the gating circuitry may be for controlling one or more clock dividers of the clock-controlled (or analogue-to-digital converter or digital-to-analogue converter) circuitry. The one or more clock dividers may be configured to output one or more clock signals for sampling a/the data input signal.

According to an embodiment of a second aspect of the present invention, there is provided alignment circuitry for use with clock-controlled circuitry, the alignment circuitry comprising: a first clocked latch configured to receive a synchronization signal having an enable edge and a target clock signal and to output an enable signal having an enable edge corresponding to the enable edge of the synchronization signal and synchronized with the target clock signal; a delay circuit (or auxiliary circuitry) configured to receive the target clock signal and output a delayed target clock signal being a delayed version of the target clock signal; a second clocked latch configured to receive the enable signal and the delayed target clock signal and to output a re-timed enable signal having an enable edge corresponding to the enable edge of the enable signal and synchronized with the delayed target clock signal; and gating circuitry configured to receive the delayed target clock signal and the re-timed enable signal and to start output of the delayed target clock signal at a timing defined by the enable edge of the re-timed enable signal for controlling the clock-controlled circuitry.

According to an embodiment of a third aspect of the present invention, there is provided calibration circuitry comprising: delay circuitry configured to apply a delay to a synchronization clock signal and output a delayed synchronization clock signal; a phase detector configured to measure a phase difference between the delayed synchronization clock signal and a target clock signal and output a measurement signal indicating the phase difference; a comparator configured to compare the measurement signal to a reference signal and output a comparison signal; and control circuitry (a controller) configured to, based on the comparison signal, adjust the delay applied to the synchronization clock signal by the delay circuitry to bring the delayed synchronization clock signal and the target clock signal into or towards a target phase relationship.

Such circuitry may accurately synchronize the synchronization clock signal with the target clock signal. Such circuitry may carry out the synchronization efficiently by measuring the phase difference between the delayed synchronization clock signal and the target clock signal and then adjusting the delay applied to the synchronization clock signal by the delay circuitry to bring the delayed synchronization clock signal and the target clock signal into or towards a target phase relationship.

The control circuitry may be configured to: based on the comparison signal, determine a difference between the measurement signal and the reference signal; and based on the determined difference (between the measurement signal and the reference signal), adjust the delay applied to the synchronization clock signal by the delay circuitry to bring the delayed synchronization clock signal and the target clock signal into or towards a target phase relationship.

The control circuitry may be configured to adjust the delay applied to the synchronization clock signal by the delay circuitry to reduce to or towards zero the determined difference (between the measurement signal and the reference signal).

The control circuitry may be configured to adjust the delay applied to the synchronization clock signal by the delay circuitry to reduce to or towards zero the phase difference between the delayed synchronization clock signal and the target clock signal The control circuitry may be configured to determine the/a difference between the measurement signal and the reference signal by: based on the comparison signal, adjusting the reference signal from a first value corresponding to a target phase difference between the delayed synchronization clock signal and the target clock signal until the comparison signal indicates the reference signal has reached or passed the measurement signal, the reference signal having a second value when the comparison signal indicates the reference signal has reached or passed the measurement signal; and determining the difference between the first and second values of the reference signal as the difference between the reference signal and the measurement signal.

Determining the difference between the measurement signal and the reference signal may be or may comprise determining the difference between the measurement signal and the first value of the reference signal.

The control circuitry may be configured to set the reference signal at the first value (a first value corresponding to a target phase difference between the delayed synchronization clock signal and the target clock signal) while adjusting the delay applied to the synchronization clock signal by the delay circuitry.

The reference signal and measurement signals may be voltage signals, the comparator may be configured to compare the voltage levels of the reference and measurement signals, respectively, and the comparison signal may indicate which of the reference and measurement signals has a higher (or lower) voltage level.

The control circuitry may be configured to adjust the delay applied to the synchronization clock signal by the delay circuitry until the comparison signal indicates that the measurement signal has reached or passed the reference signal.

The control circuitry may be configured to adjust the delay applied to the synchronization clock signal by the delay circuitry until the comparison signal indicates that the measurement signal has reached or passed the reference signal a plurality of times.

The control circuitry may be configured to set the reference signal at the first value (a first value corresponding to a target phase difference between the delayed synchronization clock signal and the target clock signal) while adjusting the delay applied to the synchronization clock signal by the delay circuitry.

The delay circuitry may comprise variable delay circuitry configured to be controlled by an analogue control signal and a delay digital-to-analogue converter configured to convert a digital control signal into the analogue control signal. The control circuitry may be configured to provide the digital control signal to the delay digital-to-analogue converter and to adjust the delay applied to the synchronization clock signal by adjusting the value of the digital control signal.

The control circuitry may be configured to adjust the delay applied to the synchronization clock signal by the delay circuitry by adjusting delay bits of a control signal received by the delay circuitry.

The delay circuitry may comprise variable delay circuitry. The delay circuitry may comprise a variable delay buffer. The delay circuitry may comprise a variable delay buffer configured to apply the delay and a delay adjuster configured to control the delay applied by the variable delay buffer in terms of delay bits.

The controller may be configured to adjust the delay applied by the delay circuitry by sending a control signal to the delay adjuster varying the delay bits.

The controller may comprise a calibration network configured to control or adjust the reference signal and a delay controller configured to control the delay applied by the delay circuitry.

The calibration network may be configured to determine the difference between the (first value of the) reference signal and the measurement signal.

The delayed synchronization clock signal may be for controlling clock-controlled circuitry. The clock-controlled circuitry may be digital-to-analogue converter circuitry or analogue-to-digital converter circuitry.

The delayed synchronization clock signal may be for controlling one or more clock dividers of the clock-controlled (or analogue-to-digital converter or digital-to-analogue converter) circuitry. The one or more clock dividers may be configured to output one or more clock signals for sampling a/the data input signal.

According to an embodiment of a fourth aspect of the present invention, there is provided calibration and alignment circuitry comprising the calibration circuitry of the third aspect and the alignment circuitry of the first or second aspect, wherein the alignment circuitry is configured to receive the delayed synchronization clock signal output from the calibration circuitry as the synchronization signal.

In other words, there is provided calibration and alignment circuitry for use with clock-controlled circuitry, the calibration and alignment circuitry comprising calibration circuitry and alignment circuitry, wherein the calibration circuitry comprises: delay circuitry (or first delay circuitry) configured to apply a delay to a synchronization clock signal and output a delayed synchronization clock signal; a phase detector configured to measure a phase difference between the delayed synchronization clock signal and a target clock signal and output a measurement signal indicating the phase difference; a comparator configured to compare the measurement signal to a reference signal and output a comparison signal; and control circuitry (a controller) configured to, based on the comparison signal, adjust the delay applied to the synchronization clock signal by the delay circuitry to bring the delayed synchronization clock signal and the target clock signal into or towards a target phase relationship, and wherein the alignment circuitry comprises: a first clocked latch configured to receive the delayed synchronization clock signal having an enable edge (as its data signal) and the target clock signal (as its clock signal) and to output an enable signal having an enable edge corresponding to the enable edge of the delayed synchronization clock signal and synchronized with the target clock signal; a second clocked latch configured to receive the enable signal (as its data signal) and a delayed target clock signal (as its clock signal), being a version of the target clock signal having been delayed by a delay circuit (or auxiliary circuitry or second delay circuitry) of the clock-controlled circuitry, and to output a re-timed enable signal having an enable edge corresponding to the enable edge of the enable signal and synchronized with the delayed target clock signal; and gating circuitry configured to receive the delayed target clock signal and the re-timed enable signal and to start output of the delayed target clock signal at a timing defined by the enable edge of the re-timed enable signal for controlling the clock-controlled circuitry.

According to an embodiment of a fifth aspect of the present invention, there is provided a digital-to-analogue converter or an analogue-to-digital converter comprising the alignment circuitry of the first or second aspect or the calibration circuitry of the third aspect or the calibration and alignment circuitry of the fourth aspect, wherein the digital-to-analogue converter or the analogue-to-digital converter is the clock-controlled circuitry.

According to an embodiment of a sixth aspect of the present invention, there is provided digital-to-analogue converter circuitry or analogue-to-digital converter circuitry comprising a plurality of digital-to-analogue converters or analogue-to-digital converters, each digital-to-analogue converter or analogue-to-digital converter being a digital-to-analogue converter or analogue-to-digital converter of the fifth aspect.

In other words, according to the fifth aspect, there is provided a digital-to-analogue converter comprising the alignment circuitry of the first or second aspect or the calibration circuitry of the third aspect or the calibration and alignment circuitry of the fourth aspect, wherein the digital-to-analogue converter is the clock-controlled circuitry.

In other words, according to the sixth aspect, there is provided digital-to-analogue converter circuitry comprising a plurality of digital-to-analogue converters, each digital-to-analogue converter being a digital-to-analogue converter of the fifth aspect.

Each digital-to-analogue converter may receive the synchronization signal and the target clock signal common to the plurality of digital-to-analogue converters.

A delay amount of a said delayed target clock signal compared to the target clock signal in a first said digital-to-analogue converter may be different from another delay amount of another said delayed target clock signal compared to the target clock signal in a second said digital-to-analogue converter.

In other words, according to the fifth aspect, there is also provided an analogue-to-digital converter comprising the alignment circuitry of the first or second aspect or the calibration circuitry of the third aspect or the calibration and alignment circuitry of the fourth aspect, wherein the analogue-to-digital converter is the clock-controlled circuitry.

In other words, according to the sixth aspect, there is also provided analogue-to-digital converter circuitry comprising a plurality of analogue-to-digital converters, each analogue-to-digital converter being an analogue-to-digital converter of the fifth aspect.

Each analogue-to-digital converter may receive the synchronization signal and the target clock signal common to the plurality of analogue-to-digital converters.

A delay amount of a said delayed target clock signal compared to the target clock signal in a first said analogue-to-digital converter may be different from another delay amount of another said delayed target clock signal compared to the target clock signal in a second said analogue-to-digital converter.

According to an embodiment of a seventh aspect of the present invention, there is provided integrated circuitry such as an IC chip comprising the alignment circuitry of the first or second aspect or the calibration circuitry of the third aspect or the calibration and alignment circuitry of the fourth aspect or the digital-to-analogue converter or analogue-to-digital converter of the fifth aspect or the digital-to-analogue converter circuitry or analogue-to-digital converter circuitry of the sixth aspect.

Features of any of the above aspects may be applied to any others of the above aspects.

Reference will now be made, by way of example, to the accompanying drawings, of which.

Figure 2:
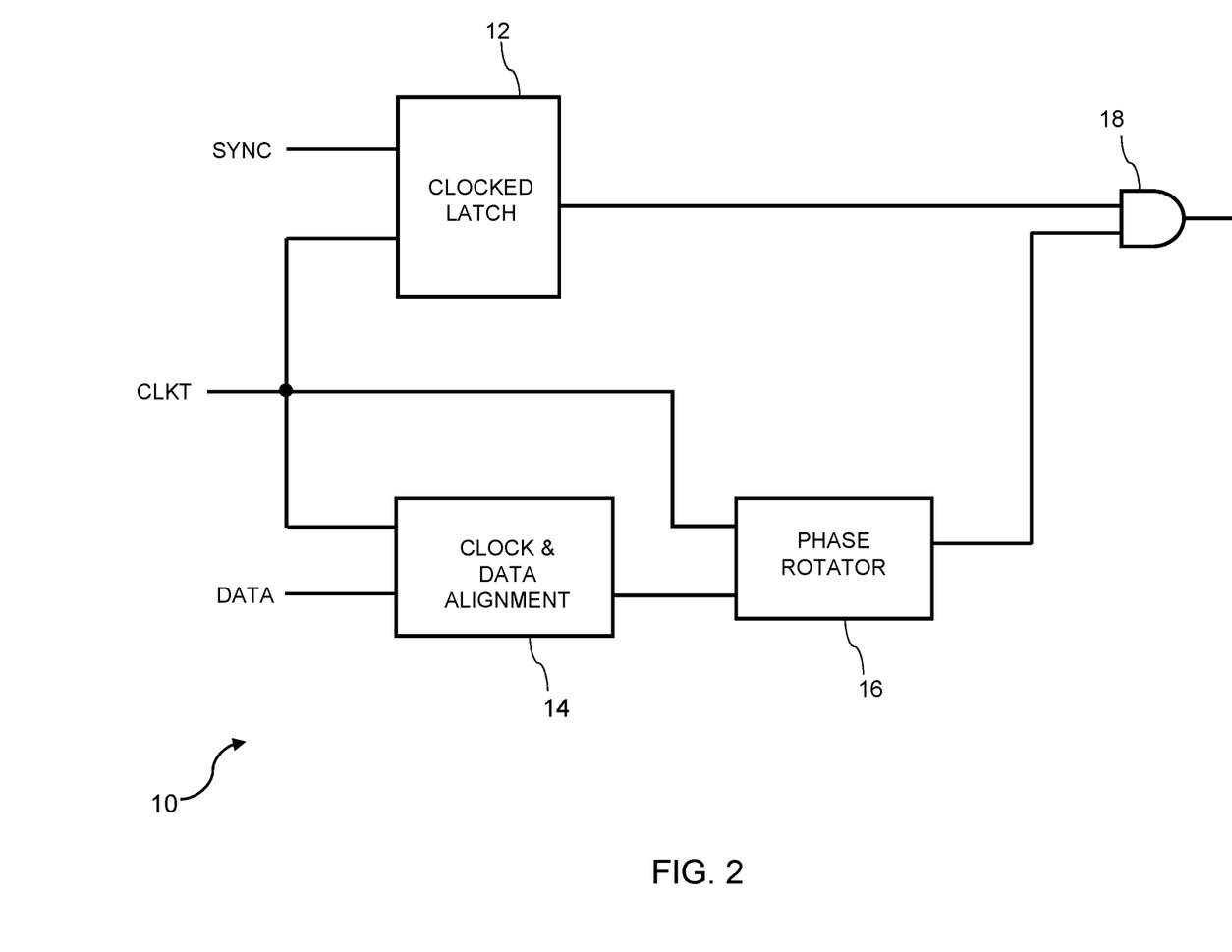
FIG. 2 is a schematic diagram of alignment circuitry as a comparative example.

FIG. 2 is a schematic diagram of alignment circuitry 10 as a comparative example. Alignment circuitry 10 may be employed in circuitry 1 shown in FIG. 1 to provide the clock generator or divider 320 with its input clock signals at a particular timing and/or start output of one or more clock signals from the clock generator or divider 320 (which along with the other dividers 330 and 340 is provided per channel) at a particular timing so that e.g. the clock dividers (generators) for a DAC channel output the required clock signals in a synchronised manner compared to the required clock signals output by corresponding clock dividers (generators) for another DAC channel. Such synchronisation can help to prevent DAC channels outputting their data out of order which would generate noise in the ultimate output signal. The same considerations may apply for ADC channels.

Alignment circuitry 10 comprises a clocked latch 12, clock and data alignment circuitry 14, a phase rotator (phase interpolator) 16, and an AND gate 18. Alignment circuitry receives as inputs a synchronisation signal SYNC (which may be a clock or pulse signal) and a target clock signal CLKT (and also a data signal DATA). The target clock signal CLKT may be considered to correspond to the clock signals output from the clock generator 310 in FIG. 1. The synchronisation signal SYNC has an enable edge. The clocked latch 12 receives as inputs the synchronisation signal SYNC (as its data signal) and the target clock signal CLKT (as its clock signal) and outputs an enable signal having an enable edge corresponding to the enable edge of the synchronization signal and synchronized with the target clock signal.

The phase rotator 16 generally rotates the phase of the target clock signal CLKT based on output from clock and data alignment circuitry 14 to try to match or align the timings of the data signal and the target clock signal CLKT (i.e. so that the rising and/or falling edges of the target clock signal occur in the middle of a data window of the data signal, or so that a pulse of the target clock signal is centered within a data window of the data signal, i.e. a period between changes in data value). In an initial start-up phase of clock-controlled circuitry used with the alignment circuitry 10 (e.g. clock-controlled circuitry 1) it is assumed for convenience that the phase rotator 16 does not perform any phase rotation specifically for matching the target clock signal CLKT with the data signal, but the target clock signal having passed through the phase rotator 16 and arriving at the input of the AND gate 18 does pick up a delay compared to the timing of the enable signal at least due to the signal path through the phase rotator 16. Therefore the phase rotator 16 can be considered to output a delayed target clock signal.

The AND gate 18 receives as inputs the enable signal and the delayed target clock signal and starts output of the delayed target clock signal at a timing defined by the enable edge of the enable signal. The delayed target clock signal may be considered to correspond to the clock signals input to the clock generator/divider 320 in clock-controlled circuitry 1 so that the gated output of the delayed target clock signal starts output of one or more clock signals from the divider 320. Ideally, the associated clock-controlled circuitry (across different DACs, i.e. different DAC channels) is synchronized due to the timing (defined by the enable edge of the enable signal) of the start of the output of the delayed target clock signal. That is, clock dividers (generators) across different DACs would ideally start in a synchronized manner due to the timing of the start of the output of the delayed target clock signal in each DAC.

However, the delay of the delayed target clock signal may be different in different DACs (DAC channels). That is, the instance of the delayed target clock signal in one DAC may be delayed by a different amount relative to an instance of the delayed target clock signal in another DAC (for example due to different signal paths). This difference in delay may be such that the outputs of the DACs are no longer synchronized with each other. That is, the output of the AND gate 18 in one DAC may start with a particular edge of that instance of the delayed target clock signal, but in another DAC the corresponding edge of the other instance of the delayed target clock signal may be forward (in time/phase) of the enable edge of the enable signal and therefore the output of that instance of the delayed target clock signal may start with an edge following the edge corresponding to the particular edge of the other instance of the target clock signal. In other words, the output of the AND gate 18 in one DAC may be a clock cycle (of the delayed target clock signal) behind the output of the AND gate 18 in another DAC. This can result in the outputs of DACs being out of order and thus the overall output of a DAC (or DAC circuitry) comprising those DACs being noisy/suffering from distortion.

To avoid the situation described above, the synchronization signal SYNC and the target clock signal CLKT may be carefully calibrated in consideration of a "timing window" for an edge of the target clock signal CLKT compared to the enable edge of the synchronization signal SYNC. However due to the different paths for the instance of the delayed target clock signal in each DAC and therefore due to a difference in delay of the delayed target clock signal, this calibration must be very precise to ensure the above situation does not occur which is difficult in practice. Further, the phase rotators 16 may cause differing delays per DAC.

The same considerations apply to an ADC (comprising a plurality of ADCs/ADC channels) as the clock-controlled circuitry.

Figure 3:
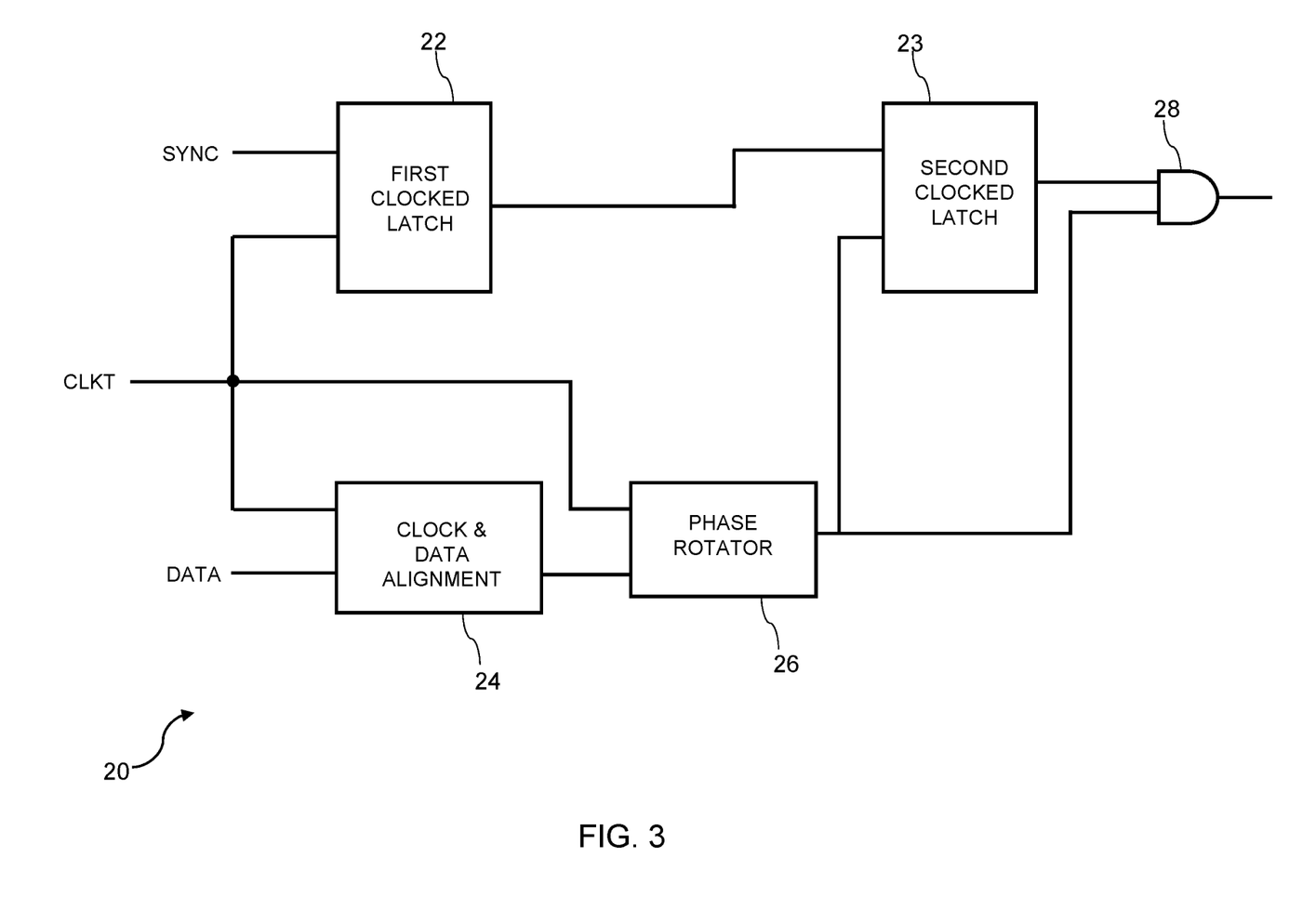
FIG. 3 is a schematic diagram of alignment circuitry.

FIG. 3 is a schematic diagram of alignment circuitry 20. Some elements of alignment circuitry 20 correspond to those of alignment circuitry 10 and have been given corresponding reference numerals (with a 2 at the start instead of a 1). Alignment circuitry 20 comprises first and second clocked latches 22 and 23, clock and data alignment circuitry 24, a phase rotator (phase interpolator) 26, and an AND gate 28. Alignment circuitry 20 in some arrangements does not itself comprise the clock and data alignment circuitry 24 and/or the phase rotator 26. The elements may be considered a part of clock-controlled circuitry with which the alignment circuitry 20 is to be used.

Alignment circuitry 20 comprises in addition to the elements in common with alignment circuitry 10, the second clocked latch 23.

The first clocked latch 22 receives as inputs the synchronization signal SYNC (as its data signal) and the target clock signal CLKT (as its clock signal) and outputs an enable signal having an enable edge corresponding to the enable edge of the synchronization signal and synchronized with the target clock signal. The operation of the first clocked latch 22 therefore corresponds to the operation of the clocked latch 12. The enable signal is a signal comprising the enable edge (which could be rising or falling depending on whether the second clocked latch is rising edge-triggered or falling edge-triggered) and for example no other edges in this arrangement, although in other arrangements it may be a clock signal.

The operation of the clock and data alignment circuitry 24 and the phase rotator 26 is the same as the operation of the corresponding elements in alignment circuitry 10 already described.

The second clocked latch 23 receives as inputs the enable signal output from the first clocked latch 22 (as its data signal) and the delayed target clock signal output from the phase rotator 26 (as its clock signal) and outputs a re-timed enable signal having an enable edge corresponding to the enable edge of the enable signal and synchronized with the delayed target clock signal. The retimed enable signal is, in this arrangement, a signal comprising the enable edge (which could be rising or falling depending on whether e.g. the clock-controlled circuitry is rising edge-triggered or falling edge-triggered) and for example no other edges. Its purpose is to define the time at which the AND gate 28 starts output of the delayed target clock signal.

The AND gate 28 receives as inputs the re-timed enable signal and the delayed target clock signal and starts output of the delayed target clock signal at a timing defined by the enable edge of the re-timed enable signal (here assuming that the enable edge is a rising edge).

The enable edge of the synchronization signal SYNC may be referred to as a synchronization enable edge. The enable edge of the enable signal may referred to as an enable signal enable edge. The enable edge of the retimed enable signal may be referred to as a retimed enable edge.

Due to the re-timing of the enable signal by the second clocked latch 23, the situation in which the outputs of DACs (DAC channels) are out of order as described above with reference to the alignment circuitry 10 of FIG. 2 may not occur in alignment circuitry 20. That is, the re-timed enable signal has an enable edge synchronized with the delayed target clock signal and therefore each AND gate 28 across a plurality of DACs starts output of the delayed target clock signal with the corresponding clock cycle of the delayed target clock signal.

In more detail, the synchronization signal SYNC and the target clock signal CLKT still require calibration in consideration of a timing window for an edge of the target clock signal CLKT compared to the enable edge of the synchronization signal SYNC, however the calibration when using alignment circuitry 20 does not need to be as precise as when using alignment circuitry 10. This is because the amount of possible delay of the target clock signal CLKT that needs to be compensated for by the calibration is less when using alignment circuitry 20 than when using alignment circuitry 10 because in alignment circuitry 20 the enable signal is re-timed according to the delayed target clock signal by the second clocked latch 23 whereas in alignment circuitry 10 the path from the CLKT input to the AND gate 18 can give rise to a cumulative delay of the delayed target clock signal requiring more precise calibration.

In light of the above, alignment circuitry 20 results in a lower chance of out-of-order outputs of the clock-controlled circuitry (e.g. a DAC (or DAC circuitry) comprising a plurality of DACs or DAC channels, or an ADC (or ADC circuitry) comprising a plurality of ADCs or ADC channels), and/or enables less accurate set-up calibration between the target clock signal CLKT and the synchronization signal SYNC, and/or less accurate clock generators for generating the synchronization signal SYNC and/or the target clock signal CLKT.

The phase rotator 16 may be referred to as auxiliary circuitry. The clock-controlled circuitry may for example correspond to part of the clock-controlled circuitry 1 (for example, the ADC 100 plus the dividers/clock generators 320, 330, 340, or the DAC 200 plus the dividers/clock generators 320, 330, 340) but is not necessarily DAC or ADC circuitry and may be any circuitry with components controlled by clock signals. The clock-controlled circuitry may be a single DAC channel comprising a plurality of slices and the alignment circuitry 20 may (in some arrangements) be aimed at achieving synchronization across the DAC slices. The clock-controlled circuitry may be a single ADC channel comprising a plurality of sub-ADC units and the alignment circuitry 20 may be aimed at achieving synchronization across the sub-ADC units. Of course, in other arrangements the alignment circuitry 20 may be aimed at achieving synchronization across multiple DAC channels, multiple ADC channels, or (in some arrangements) DAC and ADC channels.

The AND gate 28 may be referred to as gating circuitry and is not necessarily an AND gate 28 shown in FIG. 3. The gating circuitry 28 may be any circuitry that is configured to perform the operations of the AND gate 28 described above, or other logical operations if for example the enable edge is a falling edge. The second clocked latch 23 may be/comprise a flip-flop, for example a D-type flip-flop or D flip-flop. The second clocked latch 23 may have other inputs such as a reset and/or an enable input which are not shown in FIG. 3. The first clocked latch 22 may have a structure as illustrated in FIG. 4, described below.

Figure 4:
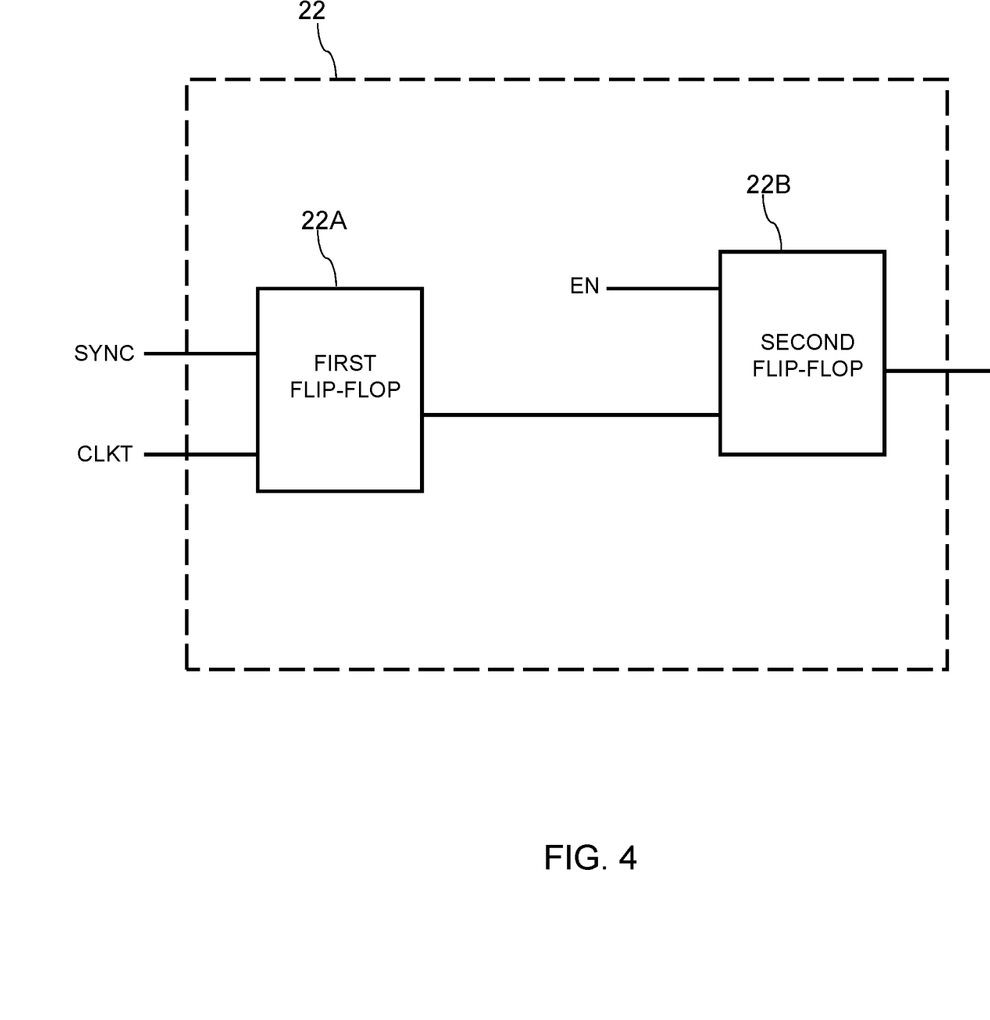
FIG. 4 is schematic diagram of a part of alignment circuitry.

FIG. 4 is a schematic diagram of the first clocked latch 22. The first clocked latch 22 comprises a primary clocked latch 22A and a secondary clocked latch 22B, each of which may be/comprise a flip-flop, for example a D-type flip-flop or D flip-flop. Each of the primary clocked latch 22A and the secondary clocked latch 22B may have other inputs such as a reset and/or an enable input which are not shown in FIG. 4. The primary and secondary clocked latches 22A and 22B will be referred to as first and second flip-flops 22A and 22B, respectively.

The first flip-flop 22A receives as inputs the synchronization signal SYNC having the enable edge (as its data signal) and the target clock signal CLKT (as its clock signal). Specifically the first flip-flop 22A receives SYNC in its "data" input and CLKT in its "clock" input. The first flip-flop 22A outputs an aligned synchronization signal having an aligned enable edge corresponding to the enable edge of the synchronization signal synchronized with the target clock signal.

The second flip-flop 22B receives as inputs the aligned synchronization signal output from the first flip-flop 22A (as its clock signal) and a precursor or static enable signal EN having a logic value "1" (as its data signal). Specifically the second flip-flop 22B receives EN in its "data" input and the aligned synchronization signal in its "clock" input. The second flip-flop 22B outputs the enable signal which has the enable edge which corresponds to the aligned enable edge of the aligned synchronization signal and synchronized with the aligned synchronization signal.

The first clocked latch 22 may have a structure different from that illustrated in FIG. 4.

Figure 5:
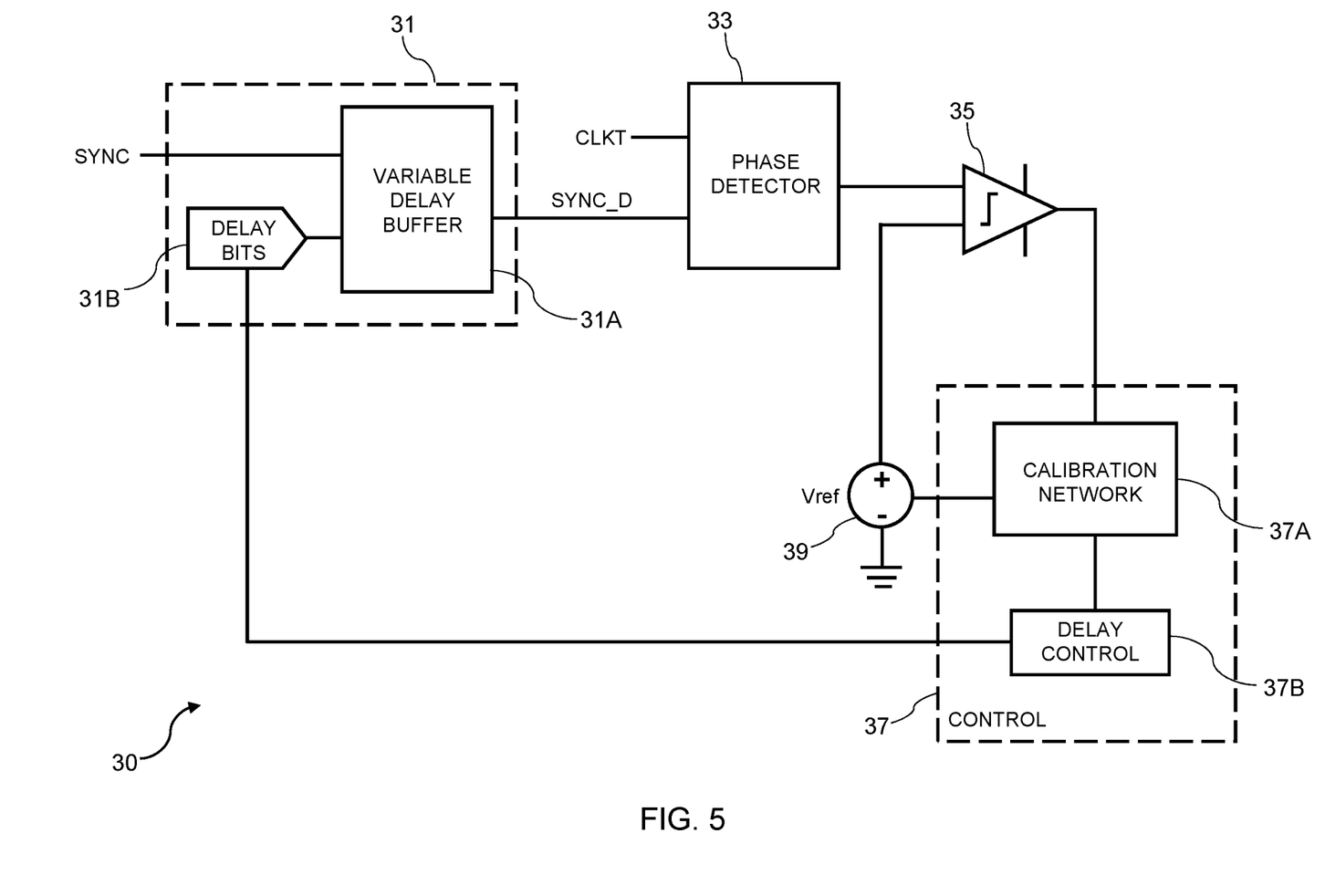
FIG. 5 is schematic diagram of calibration circuitry.

FIG. 5 is a schematic diagram of calibration circuitry 30. Calibration circuitry 30 may be implemented with alignment circuitry 20, for use in/with clock-controlled circuitry, for example a DAC or an ADC, for example clock-controlled circuitry 1. Calibration circuitry 30 is configured to provide a delayed synchronization signal SYNC_D calibrated to be aligned with a target clock signal CLKT. When used with alignment circuitry 20, calibration circuitry 30 may therefore provide the delayed synchronization signal SYNC_D which is calibrated to be aligned with the target clock signal CLKT as the synchronization signal input to the first clocked latch 22 in place of the synchronization signal SYNC. Thus, the synchronization signal input to the first clocked latch 22 is termed "SYNC" however when used with the calibration circuitry 30 this signal which is provided to the alignment circuitry 20 is termed "SYNC_D".

Calibration circuitry 30 comprises delay circuitry 31, a phase detector 33, a comparator 35, a controller (which may be referred to as control circuitry) 37, and a voltage generator (voltage source) 39. The delay circuitry 31 comprises a variable delay buffer 31A and a delay adjuster 31B. The controller 37 comprises a calibration network 37A and a delay controller 37B.

The delay circuitry 31 is configured to receive a synchronization signal SYNC (which in this case is a clock signal and may be referred to as a synchronization clock signal), apply a delay to the synchronization signal SYNC and output a delayed synchronization signal SYNC_D. The phase detector 33 is configured to receive the delayed synchronization signal SYNC_D and a target clock signal CLKT, measure the phase difference between the two signals, and output a measurement signal indicating the phase difference. The comparator 35 is configured to receive the measurement signal and a reference signal Vref from the voltage generator 39, compare the two signals, and output a comparison signal indicating a result of the comparison. The controller 37 is configured to receive the comparison signal and based on the comparison signal determine the difference between the measurement signal and the reference signal. The controller 37 is further configured to, based on the determined difference, adjust the delay applied to the synchronization clock signal by the delay circuitry 31 to bring the delayed synchronization clock signal SYNC_D and the target clock signal CLKT into or towards a target phase relationship.

The target relationship may for example be that the delayed synchronization clock signal SYNC_D and the target clock signal CLKT are in phase with one another. The controller 37 may be configured to, based the determined difference, adjust the delay to reduce the difference between the measurement signal and the reference signal to or towards zero, and/or reduce to or towards zero the phase difference between the delayed synchronization clock signal SYNC_D and the target clock signal CLKT.

The controller 37 is configured, in a first mode of operation, to determine the difference between the measurement signal and the reference signal Vref as follows. The controller 37 adjusts, based on the comparison signal, the reference signal Vref from a first value Vref1 until the comparison signal indicates that the reference signal has reached or passed the measurement signal. The first value Vref1 of the reference signal corresponds to a target phase difference (or delay) between the delayed synchronization clock signal SYNC_D and the target clock signal CLKT, for example zero phase difference. The value of the reference signal when the comparison signal indicates that the reference signal has reached or passed the measurement signal is taken as a second value Vref2. The controller 37 determines the difference between the first and second values of the reference signal, Vref1, Vref2 as the difference between the measurement signal and the reference signal.

The controller 37 converts this difference into a delay adjustment and on this basis adjusts the delay applied by the delay circuitry 31 to the synchronization signal SYNC. The process may be repeated and/or continually iterated to bring the delayed synchronization signal SYNC_D to or towards the target clock signal CLKT in terms of the phase of each signal.

The measurement signal and the reference signal are voltage signals defining a voltage level and the difference between these two signals is a voltage difference. The difference between the measurement signal and the reference signal as described above is the difference between the measurement signal and the first value of the reference signal Vref1. The controller 37 adjusts the reference signal by controlling the voltage generator 39.

The controller 37 comprises the calibration network 37A and the delay controller 37B. In a running example, the calibration network 37A carries out the adjustment of the reference signal (in the first mode of operation) and the delay controller 37B adjusts the delay applied by the delay circuitry 31. It will be apparent that the controller 37 may have different structures.

The delay circuitry 31 comprises the variable delay buffer 31A and the delay adjuster 31B. In the running example the variable delay buffer 31A applies the delay to the synchronization signal SYNC and the delay adjuster 31B is controlled by a control signal from the controller 37 to adjust the delay applied by the variable delay buffer 31A.

For example, the variable delay buffer 31A may be configured to be controlled by an analogue control signal and the delay adjuster 31B may be a delay digital-to-analogue converter configured to convert a digital control signal into the analogue control signal. The controller 37 may be configured to provide the digital control signal to the delay digital-to-analogue converter 31B and to adjust the delay applied to the synchronization clock signal SYNC_D by adjusting the value of the digital control signal.

As an alternative, the delay adjuster 31B may comprise a register configured to store "delay bit" whose value represents the intended delay. The variable delay buffer 31A may be configured to be controlled by the delay bits, i.e. effectively to be controlled by a digital input. In that case, the controller 37 controls the delay by adjusting the delay bits.

The controller 37 may therefore convert the determined difference between the measurement signal and the (first value of the) reference signal Vref1 to an adjustment of delay bits, or to a delay amount (and the delay adjuster 31B may convert that delay amount to an adjustment of delay bits). It will be apparent that the delay circuitry 31 may have different structures. Further, the delay circuitry 31 may not operate in terms of "delay bits".

The comparison signal output by the comparator 35 may be a signal indicating which one of the measurement signal and the reference signal has a higher voltage level and may not indicate the magnitude of the difference between the measurement signal and the reference signal.

An initial delay amount applied by the variable delay buffer 31A or by the delay circuitry 31 (i.e. a delay amount applied to the synchronization signal SYNC when determining the difference between the (first value of the) reference signal and the measurement signal by varying the reference signal) may a known minimum delay or a midscale delay.

With the reference signal set to the first value Vref1 (which corresponds to a target delay between the delayed synchronization clock signal SYNC_D and the target clock signal CLKT) the controller 37 may, in a second mode of operation, adjust the delay applied by the delay circuitry 31 to the synchronization signal SYNC until the comparison signal indicates that the measurement signal has reached or passed the reference signal rather than adjust the reference signal. The controller 37 may repeat this process and/or continually iterate this process to bring the delayed synchronization signal SYNC_D to or towards the target clock signal CLKT in terms of the phase of each signal. In this way, the controller 37 may also, based on the comparison signal, determine a difference between the measurement signal and the reference signal Vref/Vref1.

The first and second modes could be used in combination. For example, in an implementation the controller 37 operates in the first operation mode described above (adjusts the reference signal Vref to measure the difference between the reference signal Vref and the measurement signal, converts the difference to a delay adjustment, and adjusts the delay applied by the delay circuitry 31) in a first step as a "coarse adjustment", and then operates in the second operation mode described above in a second step as a "fine adjustment". In this implementation the process of the first operation mode may be performed only once as a coarse adjustment step, or it may be repeated any number of times before using the second operation mode.

In another implementation, for example, the controller 37 operates in the second operation mode in a first step as a coarse adjustment, and then in the first operation mode in a second step as a fine adjustment. For example, the controller 37 may adjust the delay applied by the delay circuitry 31 in the first step until the comparison signal indicates the measurement signal has reached or passed the reference signal Vref a particular number of times, e.g. once or twice (or any other number) before using the first operation mode in the second step.

The first value of the reference signal Vref1 which corresponds to a target delay between the delayed synchronization clock signal SYNC_D and the target clock signal CLKT may be preset or determined in a set-up process prior to the calibration described above.

The calibration carried out by the calibration circuitry 30 is useful to maintain a timing window between the target clock signal CLKT and the synchronization signal (or delayed synchronization signal) to achieve successful alignment for example by the alignment circuitry 20 despite system path delays and clock skew. Calibration circuitry 30 may be provided along with alignment circuitry 20 per channel—i.e. in each DAC/ADC channel of an overall DAC/ADC. The controller 37 may be centralized and common to multiple DACs (DAC channels) of an overall DAC and may output control signals for each DAC channel in the overall DAC. At least the phase detector 33 and the comparator 35 are provided per DAC of the overall DAC. The same considerations apply to an ADC comprising a plurality of ADCs (ADC channels).

Figure 6:
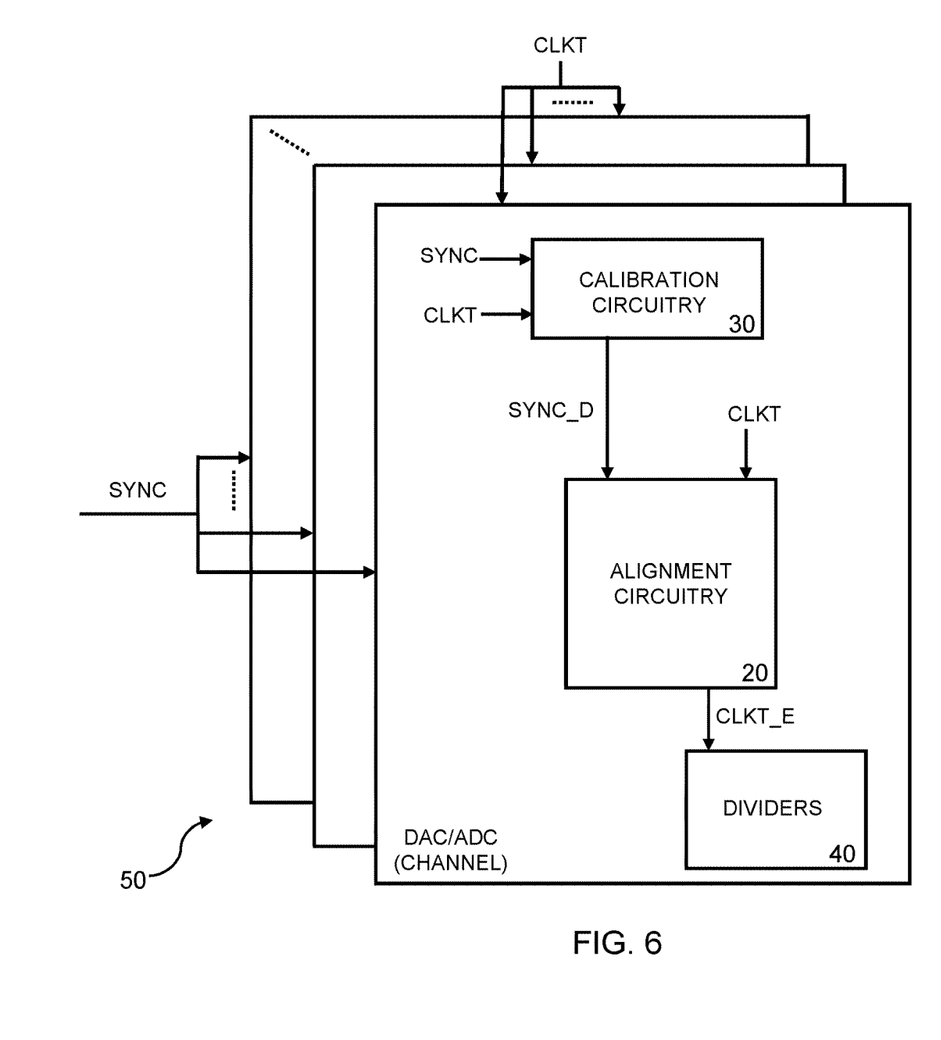
FIG. 6 is schematic diagram of DAC and/or ADC circuitry.

FIG. 6 is a schematic diagram of clock-controlled circuitry 50 which may for example be a DAC or an ADC 50. The circuitry 50 will be described hereinafter as a DAC or as DAC circuitry for the sake of convenience. The DAC circuitry 50 comprises a plurality of DACs or DAC channels (each optionally comprising a plurality of DAC slices). Each DAC (DAC channel) may comprise circuitry corresponding to part of that illustrated in FIG. 1 ((for example, the DAC 200 plus the dividers/clock generators 320, 330, 340), with the elements of the clock distribution circuitry 300 other than the dividers 320, 330, 340 being common to some or all of the DACs (DAC channels). Each DAC comprises alignment circuitry 20 and calibration circuitry 30.

The synchronization signal SYNC and the target clock signal CLKT are input into each DAC channel and the operation in each DAC channel is as follows. The calibration circuitry 30 receives the synchronization signal SYNC and the target clock signal CLKT and outputs a delayed synchronization signal SYNC_D. The delayed synchronization signal SYNC_D is input to the alignment circuitry 20. The target clock signal CLKT is also input to the alignment circuitry 20. The alignment circuitry 20 operates as described above with reference to FIG. 3 (and receives as its "synchronization signal" SYNC in the FIG. 3 description the delayed synchronization signal SYNC_D) and outputs (or starts output of) the delayed target clock signal at a timing defined by the enable edge of the re-timed enable signal, which is denoted by the signal CLKT_E in FIG. 6 (and corresponds to the output of gate 28 in FIG. 3). In each DAC channel, the signal CLKT_E controls the DAC (i.e. the clock dividers shown in FIG. 1).

Each DAC channel (and so the alignment circuitry 20 and calibration circuitry 30 in each DAC channel) receives the same synchronization signal SYNC (i.e. a copy/instance of the synchronization signal SYNC which may be delayed differently compared to the other DAC channels due to transmission paths) and the same target clock signal CLKT (i.e. a copy/instance of the target clock signal CLKT which may however be delayed differently compared to the other DAC channels due to transmission paths). The delayed target clock signal and the output CLKT_E of the alignment circuitry 20 may occur at different timings in each DAC channel due to the different amounts of delay of the instances of the delayed target clock signal in the respective DAC channels. However CLKT_E in each DAC channel will start at the same clock cycle of the delayed target clock signal.

The clock-controlled circuitry 50 may be ADC circuitry comprising a plurality of ADCs (or ADC channels) corresponding to part of that illustrated in FIG. 1 (for example, the ADC 100 plus the dividers/clock generators 320, 330, 340), with the elements of the clock distribution circuitry 300 other than the dividers 320, 330, 340 being common to some or all of the ADC channels.

The calibration and alignment described above could also be applied to respective slices of a single DAC or respective units of a single ADC (not comprising a plurality of ADCs). That is, the DACs/ADCs illustrated in FIG. 6 could be considered DAC slices or ADC sub-units, and the circuitry 50 could be considered a DAC or ADC rather than circuitry comprising a plurality of DACs/ADCs. The calibration and alignment could also be applied to a DAC and an ADC— i.e. the channels illustrated in FIG. 6 could be considered at least one DAC channel and at least one ADC channel, and the circuitry 50 could be considered DAC and ADC circuitry (or mixed-signal circuitry in general).

It will be appreciated that the alignment circuitry 20 and/or the calibration circuitry 30 can improve the synchronization within clock-controlled circuitry (e.g. between DACs/ADCs—channels—of DAC or ADC circuitry) to reduce the chance of respective signals being output out of order, and/or to enable less accurate components to be used in calibration and/or a set-up process e.g. to determine the first value of the reference signal.

In summary, the alignment circuitry 20 may be for timing alignment in a system with multiple DACs (e.g. MIMO—multiple input multiple output) where each DAC has its own internal phase rotation of RF input clocks (instances of the target clock signal CLKT) for clock/data alignment. The alignment is achieved by employing a system synchronization pulse (the synchronization signal SYNC) re-timed with not only the non-rotated RF input clocks (non-delayed instance of CLKT) but also the internal phase rotated RF clocks/rotated RF input clocks (i.e. the delayed instance of the target clock signal).

In a multiple DAC system where synchronized parallel operation of these DACs is crucial to system integrity, a way to align all the DACs' internal clocks to an incoming parallel data stream is required. As described with reference to FIG. 2, one way to try to achieve this is by use of a common system-generated synchronization pulse, i.e. SYNC. The SYNC pulse (synchronization signal) is fed to the parallel DACs and re-timed by the input RF clocks (CLKT) of these DACs. The re-timed SYNC pulse is used to gate the phase rotated RF clocks from propagating. The propagated phase rotated RF clocks drive the data multiplexing network for each DAC as well as load the input data from the system to feed into the DACs. The timing alignment of these clocks ensures the timing of the data stream into the parallel DACs. Careful design taking into account the path delays/skews of this SYNC pulse entering the internal logic circuit of a DAC where the SYNC pulse will be aligned with the common input RF clocks will help to guarantee that the parallel DACs are synchronized at the system level.

However, within each DAC, a clock and data alignment unit (clock and data alignment circuitry 14) is used to align the center of the relevant RF input clock to the center of the input data, as previously described. This unit drives the phase rotator 16 to shift its clock (RF input clock) in order to align the data to the center of the RF input clock. If the timing alignment of parallel DACs does not take into account this phase rotation of the RF input clocks within each DAC it will lead to some DACs catching the re-timed SYNC pulse in the current clock cycle but others catching the re-timed SYNC pulse only in the next clock cycle.

That is, once the SYNC pulse is re-timed with the input/non-rotated RF clocks, depending on the timing margin some DACs can propagate the rotated RF clock one cycle earlier than the rest (i.e. the re-timed SYNC pulse can sit just before or after the intended edge of the rotated RF clocks). To overcome this problem the circuitry 20 operates by re-timing the SYNC pulse first by the non-rotated RF input clocks and then by the rotated RF clocks and using this double-re-timed SYNC pulse to gate the propagation of the rotated RF clocks.

In summary, the calibration circuitry 30 may be for the calibration of timing alignment signals in a system similar to/the same as the multiple DAC system described above (i.e. with multiple DACs (e.g. MIMO) in which the timing alignment is achieved by using a common system-generated synchronization pulse (i.e. synchronization signal SYNC) and retiming it using the RF input clocks (i.e. target clock signal CLKT)). Calibration is required to achieve successful timing alignment in presence of system path delays and clock skew.

However, from their point of origin to the local logic end circuit within each DAC, the SYNC pulse and the buffered RF input clocks will see different path delays and skew. Calibration is required to adjust the delay between the SYNC pulse and the buffered RF input clocks and thereby maintain the timing window required between these two signals for successful timing alignment later on (e.g. required by alignment circuitry 10 or 20 or other alignment circuitry).

In an implementation adjustment of the delay between the SYNC pulse and RF input clocks is achieved by first detecting the delay between them and then adding that delay to the leading signal before entering the alignment circuitry. The SYNC pulse is set as the leading signal and is fed through a variable delay buffer 31A with initial setting at a known minimum delay. This buffered SYNC pulse is used in the phase detector 33. Using the phase detector 33 and the rest of calibration circuitry 30, once the actual delay is measured, this delay is added back to the variable delay buffer 31A (i.e. by varying the delay bits of the variable delay buffer 31A according to the measured delay).

In more detail, the phase detector 33 measures the delay between the SYNC pulse and buffered RF input clocks and outputs a voltage proportional to the delay (measurement signal). This voltage is then compared against a reference voltage (first value of the reference signal) corresponding to zero ideal delay initially. The reference voltage (reference signal) is then changed step by step by the calibration network 37A until the comparator 35 changes polarity. Since the reference voltage at startup (at the first value) corresponds to zero ideal delay, when the comparator 35 trips, the calibrated reference voltage (the second value of the reference signal) gives a measure of actual delay. The delay bits to the variable delay buffer 31A are then set accordingly.

Figure 7:
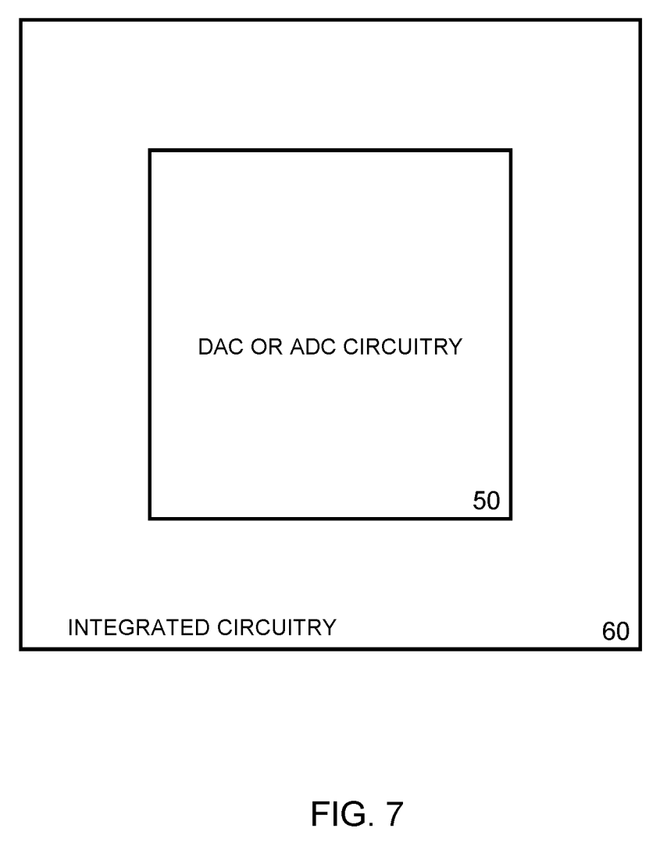
FIG. 7 is a schematic diagram of integrated circuitry.

FIG. 7 is a schematic diagram of integrated circuitry 60 such as an IC chip. Integrated circuitry 60 comprises the clock-controlled circuitry 50 (e.g. the DAC circuitry or the ADC circuitry 50 or the DAC/ADC circuitry 50, as the case may be).

Circuitry of the present invention may be implemented as integrated circuitry, for example on an IC chip such as a flip chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

The invention claimed is:

1. Alignment circuitry for use with clock-controlled circuitry, the alignment circuitry comprising:
    a first clocked latch configured to receive a synchronization signal having an enable edge and a target clock signal and to output an enable signal having an enable edge corresponding to the enable edge of the synchronization signal and synchronized with the target clock signal;
    a second clocked latch configured to receive the enable signal and a delayed target clock signal, being a version of the target clock signal having been delayed by a delay circuit of the clock-controlled circuitry, and to output a re-timed enable signal having an enable edge corresponding to the enable edge of the enable signal and synchronized with the delayed target clock signal; and
    gating circuitry configured to receive the delayed target clock signal and the re-timed enable signal and to start output of the delayed target clock signal at a timing defined by the enable edge of the re-timed enable signal for controlling the clock-controlled circuitry.

2. The alignment circuitry as claimed in claim 1, wherein the clock-controlled circuitry is digital-to-analogue converter circuitry or analogue-to-digital converter circuitry.

3. The alignment circuitry as claimed in claim 1, wherein the first clocked latch comprises:
    a primary clocked latch configured to receive the synchronization signal having the enable edge and the target clock signal and output an aligned synchronization signal having an aligned enable edge corresponding to the enable edge of the synchronization signal synchronized with the target clock signal; and
    a secondary clocked latch configured to receive a precursor enable signal and the aligned synchronization signal and output the enable signal having the enable edge which corresponds to the aligned enable edge of the aligned synchronization signal and synchronized with the aligned synchronization signal.

4. The alignment circuitry as claimed in claim 1, wherein the output of the gating circuitry is for controlling one or more clock dividers of the clock-controlled circuitry, optionally the one or more clock dividers configured to output one or more clock signals for sampling a data input signal.

5. Calibration circuitry comprising:
    delay circuitry configured to apply a delay to a synchronization clock signal and output a delayed synchronization clock signal;
    a phase detector configured to measure a phase difference between the delayed synchronization clock signal and a target clock signal and output a measurement signal indicating the phase difference;
    a comparator configured to compare the measurement signal to a reference signal and output a comparison signal; and
    control circuitry configured to, based on the comparison signal, adjust the delay applied to the synchronization signal by the delay circuitry to bring the delayed synchronization clock signal and the target clock signal into or towards a target phase relationship.

6. The calibration circuitry as claimed in claim 5, wherein the control circuitry is configured to: based on the comparison signal, determine a difference between the measurement signal and the reference signal; and based on the determined difference, adjust the delay applied to the synchronization clock signal by the delay circuitry to bring the delayed synchronization clock signal and the target clock signal into or towards a target phase relationship.

7. The calibration circuitry as claimed in claim 6, wherein the control circuitry is configured to determine the difference between the measurement signal and the reference signal by:
    based on the comparison signal, adjusting the reference signal from a first value corresponding to a target phase difference between the delayed synchronization clock signal and the target clock signal until the comparison signal indicates the reference signal has reached or passed the measurement signal, the reference signal having a second value when the comparison signal indicates the reference signal has reached or passed the measurement signal; and determining the difference between the first and second values of the reference signal as the difference between the reference signal and the measurement signal.

8. The calibration circuitry as claimed in claim 5, wherein the reference signal and measurement signals are voltage signals, wherein the comparator is configured to compare the voltage levels of the reference and measurement signals, respectively, and wherein the comparison signal indicates which of the reference and measurement signals has a higher voltage level.

9. The calibration circuitry as claimed in claim 5, wherein the control circuitry is configured to adjust the delay applied to the synchronization clock signal by the delay circuitry until the comparison signal indicates that the measurement signal has reached or passed the reference signal.

10. The calibration circuitry as claimed in claim 5, wherein: the delay circuitry comprises variable delay circuitry configured to be controlled by an analogue control signal and a delay digital-to-analogue converter configured to convert a digital control signal into the analogue control signal; and the control circuitry is configured to provide the digital control signal to the delay digital-to-analogue converter and to adjust the delay applied to the synchronization clock signal by adjusting the value of the digital control signal.

11. The calibration circuitry as claimed in claim 5, wherein the delayed synchronization clock signal is for controlling clock-controlled circuitry, optionally wherein the clock-controlled circuitry is digital-to-analogue converter circuitry or analogue-to-digital converter circuitry.

12. Calibration and alignment circuitry comprising:
calibration circuitry comprising:
  delay circuitry configured to apply a delay to a synchronization clock signal and output a delayed synchronization clock signal;
  a phase detector configured to measure a phase difference between the delayed synchronization clock signal and a target clock signal and output a measurement signal indicating the phase difference;
  a comparator configured to compare the measurement signal to a reference signal and output a comparison signal; and
  control circuitry configured to, based on the comparison signal, adjust the delay applied to the synchronization clock signal by the delay circuitry to bring the delayed synchronization clock signal and the target clock signal into or towards a target phase relationship, and
alignment circuitry comprising:
  a first clocked latch configured to receive a synchronization signal having an enable edge and a target clock signal and to output an enable signal having an enable edge corresponding to the enable edge of the synchronization signal and synchronized with the target clock signal;
  a second clocked latch configured to receive the enable signal and a delayed target clock signal, being a version of the target clock signal having been delayed by a delay circuit of the clock-controlled circuitry, and to output a re-timed enable signal having an enable edge corresponding to the enable edge of the enable signal and synchronized with the delayed target clock signal; and
  gating circuitry configured to receive the delayed target clock signal and the re-timed enable signal and to start output of the delayed target clock signal at a timing defined by the enable edge of the re-timed enable signal for controlling the clock-controlled circuitry,
wherein the alignment circuitry is configured to receive the delayed synchronization clock signal output from the calibration circuitry as the synchronization signal.

13. A digital-to-analogue converter or an analogue-to-digital converter comprising the alignment circuitry as claimed in claim 1 or the calibration circuitry as claimed in claim 5 or the calibration and alignment circuitry as claimed in claim 12, wherein the digital-to-analogue converter or the analogue-to-digital converter is the clock-controlled circuitry.

14. Digital-to-analogue converter circuitry or analogue-to-digital converter circuitry comprising a plurality of digital-to-analogue converters or analogue-to-digital converters, each digital-to-analogue converter or analogue-to-digital converter being a digital-to-analogue converter or analogue-to-digital converter as claimed in claim 13.

15. Integrated circuitry such as an IC chip comprising the alignment circuitry as claimed in claim 1 or the calibration circuitry as claimed in claim 5 or the calibration and alignment circuitry as claimed in claim 12 or the digital-to-analogue converter or analogue-to-digital converter as claimed in claim 13 or the digital-to-analogue converter circuitry or analogue-to-digital converter circuitry as claimed in claim 14.

* * * * *